United States Patent
Feng et al.

(10) Patent No.: US 11,669,016 B2
(45) Date of Patent: Jun. 6, 2023

(54) DIGITAL EXPOSURE APPARATUS AND EXPOSURE METHOD

(71) Applicant: BOE TECHNOLOGY GROUP CO., LTD., Beijing (CN)

(72) Inventors: Jing Feng, Beijing (CN); Xinglong Luan, Beijing (CN); Zhichong Wang, Beijing (CN); Peng Liu, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 17/214,678

(22) Filed: Mar. 26, 2021

(65) Prior Publication Data

US 2022/0137515 A1 May 5, 2022

(30) Foreign Application Priority Data

Oct. 30, 2020 (CN) .......................... 202011195247.5

(51) Int. Cl.
*G03F 7/20* (2006.01)
*G02B 17/02* (2006.01)
*G02B 3/00* (2006.01)
*G02B 26/08* (2006.01)
*G02B 17/06* (2006.01)

(52) U.S. Cl.
CPC ......... *G03F 7/7015* (2013.01); *G02B 3/0037* (2013.01); *G02B 17/023* (2013.01); *G02B 17/0615* (2013.01); *G02B 26/0833* (2013.01); *G02B 26/0891* (2013.01)

(58) Field of Classification Search
CPC ... G03F 7/7015; G02B 3/0037; G02B 17/023; G02B 17/0615; G02B 26/0833; G02B 26/0891
See application file for complete search history.

(56) References Cited

U.S. PATENT DOCUMENTS

| | | | | |
|---|---|---|---|---|
| 8,094,290 | B2* | 1/2012 | Owa | G03F 7/70583 355/71 |
| 8,675,180 | B2* | 3/2014 | Ahn | G03F 9/7003 356/399 |
| 9,310,697 | B2* | 4/2016 | Yun | G03F 7/2051 |
| 10,670,968 | B2* | 6/2020 | Lee | G03F 7/2059 |
| 11,448,969 | B2* | 9/2022 | Kono | G03B 21/08 |

* cited by examiner

*Primary Examiner* — Hung V Nguyen
(74) *Attorney, Agent, or Firm* — McCoy Russell LLP

(57) ABSTRACT

A digital exposure apparatus includes a lens array, the lens array at least including a first lens unit and a second lens unit, a light transposition assembly arranged on an exit light path of the second lens unit, and the light transposition assembly being used for controlling a light exiting from the second lens unit to be transposed with respect to an exposure direction of the digital exposure apparatus. When the digital exposure apparatus is used for exposure, a light passing through the first lens unit and a light penetrating through the second lens unit are needed to expose the same position for multiple times.

20 Claims, 3 Drawing Sheets

DIGITAL EXPOSURE APPARATUS AND EXPOSURE METHOD

CROSS-REFERENCE TO RELATED APPLICATION

The present application claims priority to Chinese Patent Application No. 202011195247.5 filed on Oct. 30, 2020. The entire contents of the above-listed application is hereby incorporated by reference for all purposes.

TECHNICAL FIELD

The disclosure relates to the technical field of photo-electricity, in particular to a digital exposure apparatus and an exposure method.

BACKGROUND

A digital exposure apparatus refers to an apparatus for controlling a laser emitted by a light source to irradiate a specific area through a lens assembly according to input exposure data to realize exposure of the specific area without using a photomask, so that the digital exposure apparatus has the advantages of low use cost and the like. However, the existing digital exposure apparatus has poor exposure result uniformity.

SUMMARY

In a first aspect, an embodiment of the present disclosure provide a digital exposure apparatus including a light source, a lens array and a light transposition assembly, wherein the lens array is arranged on an exit light path of the light source, the lens array at least includes a first lens unit and a second lens unit, multiple first lens units and multiple second lens units are arranged in an array, and the light transposition assembly is arranged on an exit light path of the second lens unit, and the light transposition assembly is used for controlling a light exiting from the second lens unit to be transposed with respect to an exposure direction of the digital exposure apparatus.

According to some alternative embodiments of the present disclosure, the light transposition assembly at least includes a first concave mirror and a second concave mirror, the first concave mirror and the second concave mirror are arranged face-to-face, and optical axis directions of the first concave mirror and the second concave mirror are parallel to each other.

According to some alternative embodiments of the present disclosure, the first lens unit and the second lens unit are respectively located on both sides of a target axis of the lens array, wherein the target axis is a central axis of the lens array perpendicular to the exposure direction of the digital exposure apparatus.

According to some alternative embodiments of the present disclosure, the digital exposure apparatus further includes a detection assembly, wherein the detection assembly includes an optical sensor and an optical path control module, and the optical path control module at least has a first operating state and a second operating state.

According to some alternative embodiments of the present disclosure, in the first operating state, a light exiting along the lens array is transmitted to an exposure area of the digital exposure apparatus through the optical path control module.

According to some alternative embodiments of the present disclosure, in the second operating state, a light exiting along the lens array is transmitted to the optical sensor through the optical path control module.

According to some alternative embodiments of the present disclosure, the optical path control module includes a first light guide member, the first light guide member includes a first surface, and total reflection occurs at the first surface of the first light guide member.

According to some alternative embodiments of the present disclosure, an angle between a direction of a normal line of the first surface located inside the first light guide member and a light exit direction of the lens array is smaller than a total reflection angel corresponding to a light of the light source transmitted to a gas environment in which the digital exposure apparatus operates through the first light guide member.

According to some alternative embodiments of the present disclosure, the optical path control module includes a second light guide member, the second light guide member includes a second surface, and a material of the first light guide member and a material of the second light guide member are the same.

According to some alternative embodiments of the present disclosure, the first surface of the first light guide member and the second surface of the second light guide member are arranged face-to-face.

According to some alternative embodiments of the present disclosure, in the first operating state, the first surface of the first light guide member is abutted against the second surface of the second light guide member.

According to some alternative embodiments of the present disclosure, in the second operating state, the first surface of the first light guide member is separated from the second surface of the second light guide member.

According to some alternative embodiments of the present disclosure, the optical sensor includes a base and a plurality of sensor units, and the plurality of sensor units are arranged in an array on the base.

According to some alternative embodiments of the present disclosure, the optical sensor is arranged on an optical path corresponding to total reflection of the light of the light source occurred at the first surface.

According to some alternative embodiments of the present disclosure, patterning processing of the digital exposure apparatus is dot-scanning exposure of graphics by means of a microprism in a digital micromirror device (DMD) unit.

According to some alternative embodiments of the present disclosure, the digital exposure apparatus further includes: a reflecting sheet used for reflecting a light emitted by the light source; a beam collection plate used for collecting lights when the lens array is in a non-operational state; and an optical path assembly used for implementing light transmission.

According to some alternative embodiments of the present disclosure, the optical path assembly is a lens.

In a second aspect, an embodiment of the present disclosure provide an exposure method applied to the digital exposure apparatus described in the first aspect, wherein the method includes a step of exposing an exposure area of the digital exposure apparatus, and the step of exposing the exposure area of the digital exposure apparatus includes:

controlling a light emitted by the light source to pass through the first lens unit, and exposing the exposure area by using the light passing through the first lens unit; and controlling a light emitted by the light source to sequentially pass through the second lens unit and the light transposition assembly, and exposing the exposure area by using the light which passes through the second lens unit and is transposed.

According to some alternative embodiments of the present disclosure, in case of being applied to the digital exposure apparatus described in the first aspect, the step of exposing the exposure area of the digital exposure apparatus includes:

controlling the optical path control module to be in the first operating state so that the light passing through the lens array is transmitted to the exposure area of the digital exposure apparatus through the optical path control module.

According to some alternative embodiments of the present disclosure, in case of being applied to the digital exposure apparatus described in the first aspect, the method further includes:

controlling the optical path control module to be in the second operating state;

detecting the intensity and uniformity of a light transmitted to the optical sensor through the optical path control module by using the optical sensor; and compensating the light source according to a detection result.

BRIEF DESCRIPTION OF THE DRAWINGS

In order to more clearly illustrate the technical solution of the embodiments of the present disclosure, the drawings that need to be used in the description of the embodiments of the present disclosure will be briefly described below, and it is obvious that the drawings in the following description are only some embodiments of the present disclosure, and those skilled in the art can obtain other drawings according to these drawings without involving any inventive effort.

DETAILED DESCRIPTION

The technical solution of the embodiments of the present disclosure will now be described more fully hereinafter with reference to the accompanying drawings, in which some, but not all embodiments of the disclosure are shown. Based on the embodiments in the present disclosure, all other embodiments obtained by a person of ordinary skill in the art without inventive effort are within the scope of protection of this disclosure.

An embodiment of the present disclosure provides a digital exposure apparatus.

Figure 1:
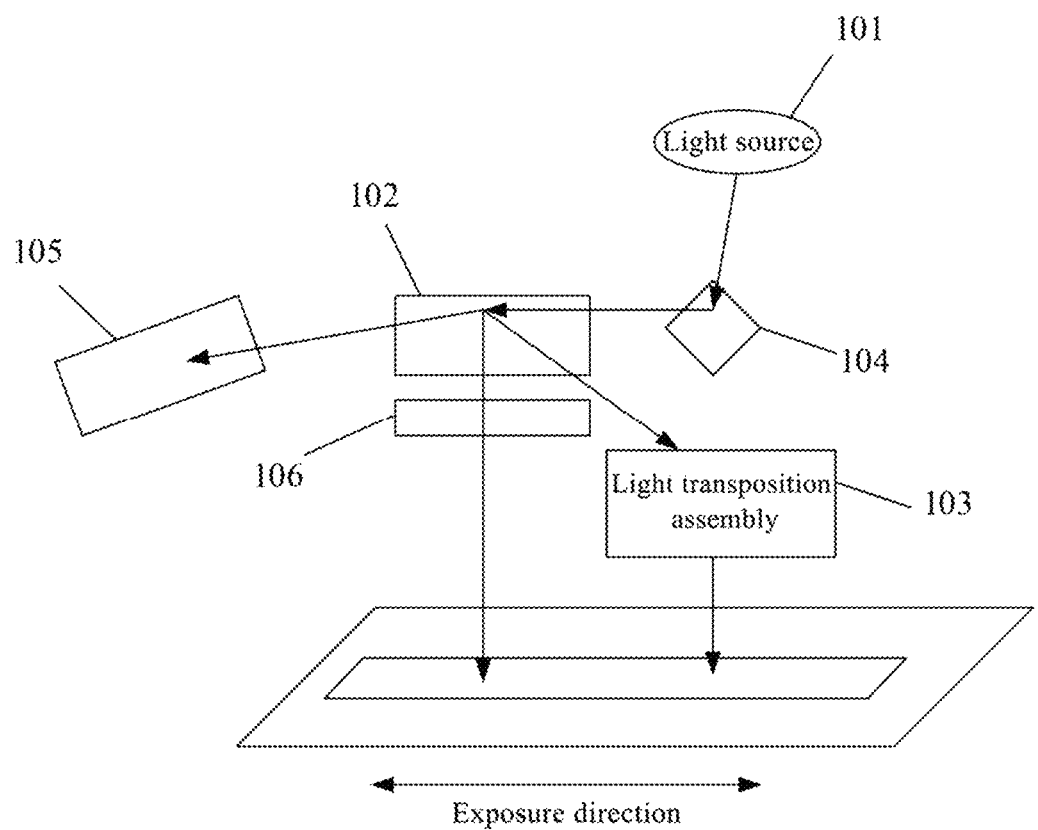
FIG. 1 is a structural diagram of a digital exposure apparatus provided by an embodiment of the present disclosure.

In one embodiment, as shown in FIG. 1, the digital exposure apparatus includes a light source 101, a lens array 102 and a light transposition assembly 103.

For example, the light source 101 in this embodiment may be selected from a light source being capable of providing a laser with a single wavelength to meet the light intensity requirement during exposure.

It should be understood that the patterning processing of the digital exposure apparatus is dot-scanning exposure of graphics by means of a microprism in a digital micromirror device (DMD) unit, which is referred to as the lens array 102 in this embodiment, and the lens array 102 includes a plurality of lens units, and on-off of each lens unit may be independently controlled or uniformly controlled by a processor.

In one embodiment, the lens array 102 is comprised of 2560*1600 microprisms, only a part of which is illustratively shown in this embodiment. Of course, those skilled in the art will appreciate that the number and distribution of the microprisms included in the lens array 102 is not limited to the above example, but may be designed according to actual needs.

The lens array 102 is arranged on an exit light path of the light source 101, and in a using process, features such as a transmission direction of a light emitted by the light source 101 are controlled by controlling the on-off of the plurality of lens units, and the light emitted by the light source 101 is used for exposing products in an exposure area.

Illustratively, the digital exposure apparatus may also include some other structures, such as a reflecting sheet 104 used for reflecting a light emitted by the light source 101; a beam collection plate 105 used for collecting lights when the lens array 102 is in a non-operational state; and an optical path assembly 106, such as a lens, used for implementing light transmission, which are not further defined and described herein.

It should be understood that patterning processing for the same position is implemented by multiple exposure operations, which typically correspond to different lens units.

Figure 2:
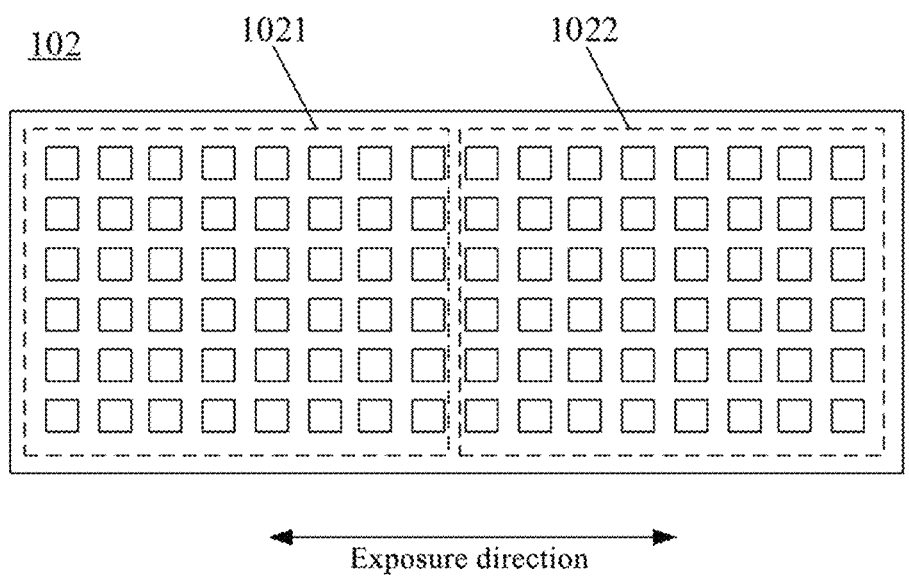
FIG. 2 is a schematic structural diagram of a lens array in an embodiment of the present disclosure.

As shown in FIG. 2, in this embodiment, the lens array 102 at least includes a first lens unit 1021 and a second lens unit 1022, and multiple first lens units 1021 and multiple second lens units 1022 are arranged in an array.

In one embodiment, the first lens unit 1021 and the second lens unit 1022 may be different lens units. In some other embodiments, the first lens unit 1021 and the second lens unit 1022 are the same lens unit. That is, the lens units are divided into two groups, one of which is the first lens unit 1021 and the other of which is the second lens unit 1022.

The light transposition assembly 103 is arranged on an exit light path of the second lens unit 1022, and the light transposition assembly 103 is used for controlling a light exiting from the second lens unit 1022 to be transposed with respect to an exposure direction of the digital exposure apparatus.

In this embodiment, the light transposition may be such that the transposed light and the original light are axially symmetrical about an axis along the exposure direction, or such that the transposed light and the original light are centrally symmetrical about a point located on the axis along the exposure direction.

The exposure light may be non-uniform due to factors such as the mounting angle of the lens array 102, the performance of the light source 101, the error of the optical path assembly 106.

Figure 3:
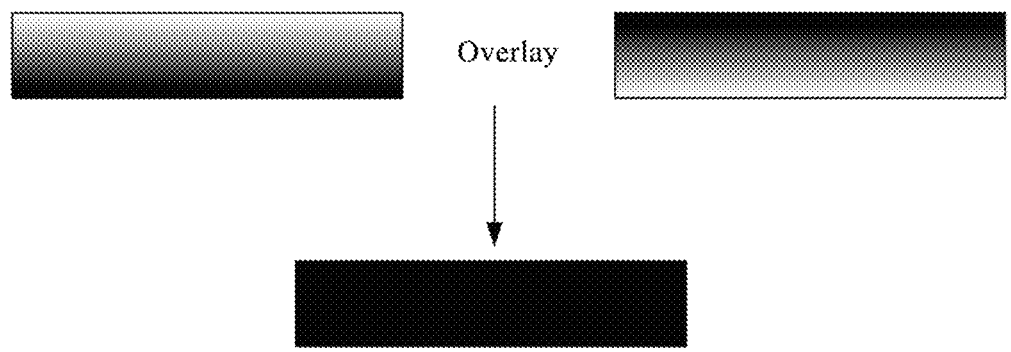
FIG. 3 is a schematic diagram of an exposure overlay in an embodiment of the present disclosure.

As shown in FIG. 3, illustratively, the upper left image in FIG. 3 represents a possible non-uniform light, i.e. the light transmitted through the first lens unit 1021 in this embodiment. In addition, the upper right image in FIG. 3 represents a transposed light, i.e. the light passing through the second lens unit 1022 and the light transposition assembly 103.

A lighter color in FIG. 3 represents a lower light intensity, and it can be seen from FIG. 3 that an upper half of the light passing through the first lens has a lower light intensity, while the intensity distribution of the transposed light is exactly opposite to the light passing through the first lens, i.e. a lower half has a lower light intensity.

In a patterning process, firstly, the exposure operation is carried out through the light corresponding to the upper left image in FIG. 3, so that the exposure intensity corresponding to the upper half is relatively low, and the exposure intensity corresponding to the lower half is relatively great. Then, the exposure operation is carried out through the light corresponding to the upper right image in FIG. 3, so that the exposure intensity corresponding to the upper half is relatively great, and the exposure intensity corresponding to the lower half is relatively low.

Because the two exposure operations correspond to the same position, the exposure intensities of the two exposures are relatively compensated, as can be seen in the lower image of FIG. 3, an overall exposure effect is relatively uniform after the exposure effects are overlaid.

The embodiment of the present disclosure includes a lens array 102, the lens array 102 at least including a first lens unit 1021 and a second lens unit 1022, a light transposition assembly 103 arranged on an exit light path of the second lens unit 1022, and the light transposition assembly 103 is used for controlling a light exiting from the second lens unit 1022 to be transposed with respect to an exposure direction of a digital exposure apparatus. When the digital exposure apparatus is used for exposure, a light passing through the first lens unit 1021 and a light passing through the second lens unit 1022 are needed to expose the same position for multiple times, due to the light passing through the first lens unit 1021 and the transposition of the light passing through the second lens unit 1022 with respect to the exposure direction of the digital exposure apparatus, even if a light emitted by a light source 101 is not uniform, due to the first lens unit 1021, after the light is transposed, the degree of non-uniformity of the exposures of the same position is counteracted, thereby improving the exposure result uniformity of the digital exposure apparatus and contributing to improve the exposure effect.

Figure 4:
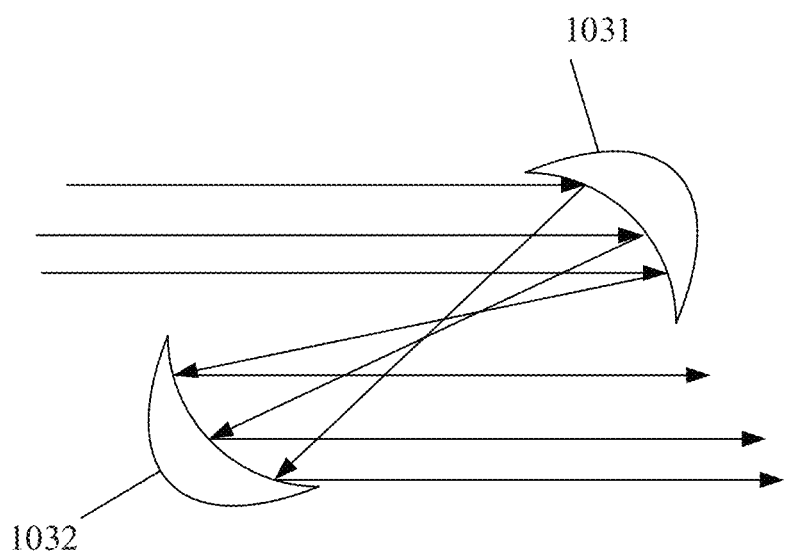
FIG. 4 is a schematic structural diagram of a light transposition assembly in an embodiment of the present disclosure.

In some embodiments, as shown in FIG. 4, the light transposition assembly 103 at least includes a first concave mirror 1031 and a second concave mirror 1032, the first concave mirror 1031 and the second concave mirror 1032 are oppositely arranged, and optical axis directions of the first concave mirror 1031 and the second concave mirror 1032 are parallel to each other. By providing the first concave mirror 1031 and the second concave mirror 1032 arranged oppositely, the control of a light transposition can be achieved.

In some other embodiments, the light may be transposed by a lens assembly, for example, by the cooperation between a plurality of concave lenses and a plurality of convex lenses, the light transposition can also be achieved.

In some embodiments, the first lens unit 1021 and the second lens unit 1022 are respectively located on both sides of a target axis of the lens array 102, wherein the target axis is a central axis of the lens array 102 perpendicular to the exposure direction of the digital exposure apparatus, as shown in FIG. 2, when the light passing through the second lens unit 1022 is transposed by the light transposition assembly 103, a direction of the output light and the original light of the first lens are basically symmetrically distributed, in particular, may be axially symmetrically or centrally symmetrically, so that a relatively uniform exposure result can be obtained after a exposure result of the light passing through the first lens unit 1021 and a exposure result of the light passing through the second lens unit 1022 are overlaid.

Figure 5:
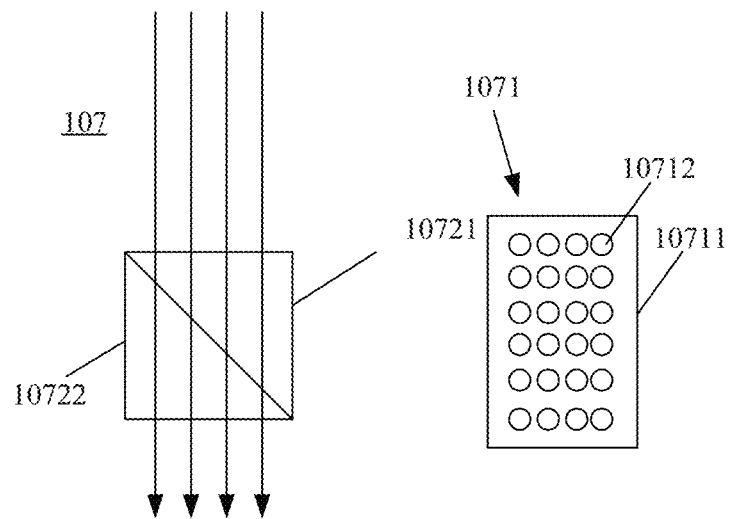
FIG. 5 is a schematic diagram of a first operating state of a detection assembly in an embodiment of the present disclosure.
Figure 6:
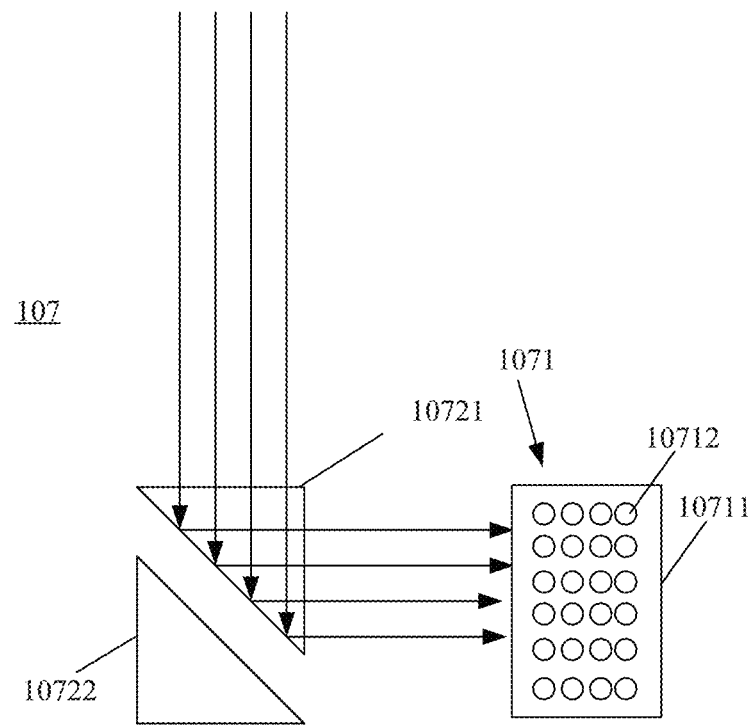
FIG. 6 is a schematic diagram of a second operating state of a detection assembly in an embodiment of the present disclosure.

As shown in FIGS. 5 and 6, in some embodiments, a detection assembly 107 is further included. The detection assembly 107 includes an optical sensor 1071 and an optical path control module, and the optical path control module at least has a first operating state and a second operating state.

In the first operating state, a light exiting along the lens array 102 is transmitted to an exposure area of the digital exposure apparatus through the optical path control module; and In the second operating state, a light exiting along the lens array 102 is transmitted to the optical sensor 1071 through the optical path control module.

In this embodiment, the optical path control module is used for controlling a transmission direction of a light.

As shown in FIG. 5, when an exposure operation is performed, the optical path control module is controlled to be in the first operating state, and at this time, the light exiting along the lens array 102 is transmitted to the exposure area of the digital exposure apparatus through the optical path control module to implement a normal exposure function.

As shown in FIG. 6, the light may also be detected prior to the exposure operation to determine whether the light provided by the light source 101 meets the requirement. In the second operating state, the transmission direction of the light is adjusted through the optical path control module, so that the light is transmitted to the optical sensor 1071 to implement the detection of the light.

With continued reference to FIG. 6, in some embodiments, the optical path control module includes a first light guide member 10721, and the first light guide member 10721 includes a first surface.

In this embodiment, an angle between a direction of a normal line of the first surface located inside the first light guide member 10721 and a light exit direction of the lens array 102 is smaller than a total reflection angle corresponding to a light of the light source 101 transmitted to a gas environment in which the digital exposure apparatus operates through the first light guide member 10721. In other words, the light emitted by the light source 101 can be totally reflected at the first light guide member 10721.

In this embodiment, when the light irradiates the first surface, which is equivalent to that the light irradiates to an interface between a material of the first light guide member 10721 and gas, the angle between the direction of the normal line of the first surface located inside the first light guide member 10721 and the light exit direction of the lens array 102 is smaller than the total reflection angle corresponding to the light of the light source 101 transmitted to the gas environment in which the digital exposure apparatus operates through the first light guide member 10721. Thus, the light can be totally reflected at the first surface of the first light guide member 10721, so that the transmission direction of the light can be adjusted.

In some embodiments, the optical path control module includes a second light guide member 10722, and the second light guide member 10722 includes a second surface. Specifically, a material of the first light guide member 10721 and a material of the second light guide member 10722 may be the same or different. In addition, the first surface of the first light guide member 10721 and the second surface of the second light guide member 10722 are oppositely arranged, i.e. arranged face-to-face.

As shown in FIG. 5, in this embodiment, in the first operating state, the first surface of the first light guide member 10721 is abutted against the second surface of the second light guide member 10722, so that when the light is transmitted to the first surface, the interface is actually an interface between the first light guide member 10721 and the second light guide member 10722, at this time, the light can pass through the first light guide member 10721 and the second light guide member 10722 and be transmitted to the exposure area.

As shown in FIG. 6, in the second operating state, the first surface of the first light guide member 10721 is separated from the second surface of the second light guide member 10722, at this time, the light can be totally reflected at the first surface and transmitted to the optical sensor 1071.

Thus, by controlling a positional relationship between the first light guide member 10721 and the second light guide member 10722, switching between the exposure operation and the light detection operation can be achieved, and the convenience of control is improved.

The optical path control module in this embodiment may be a cylinder or a cube, and obviously, may have a structure of other shapes, which is not further limited herein.

As shown in FIGS. 5 and 6, in some embodiments, the optical sensor 1071 includes a base 10711 and a plurality of sensor units 10712, the plurality of sensor units 10712 are arrayed in an array on the base 10711, the optical sensor 1071 is arranged on an optical path corresponding to total reflection of the light of the light source 101 occurred at the first surface.

In this embodiment, illustratively, a total of 24 sensor units 10712 are included, and the 24 sensor units 10712 are arranged in a 4*6 format array. Obviously, in some other embodiments, the number and arrangement of the sensor units 10712 are not limited thereto.

When the light needs to be detected, detected brightness data of the 24 sensor units 10712 is acquired. Next, the brightness data detected by each sensor unit 10712 is analyzed to obtain a brightness value at each position, and in this embodiment, a difference between the brightness values detected by different sensor units 10712 can be calculated to analyze the intensity and uniformity of the brightness of the light source.

When the magnitude of the brightness value detected by each sensor unit 10712 is greater than a certain brightness threshold value, the intensity of the light provided by the light source 101 meets the use requirement. On the other hand, if the brightness value does not reach the brightness threshold value, the control process of the light source 101 can be compensated to increase the exit brightness of the light source 101 to meet the use requirement, wherein, the brightness threshold value may be determined according to the brightness value in the exposure process.

When the difference value between the brightness values detected by the sensor units 10712 is relatively small, the degree of uniformity of the light source 101 is relatively high and meets the use requirement.

On the contrary, when the difference value between the brightness values detected by the sensor units 10712 is relatively large, the degree of uniformity of the light source 101 is relatively low, and the degree of uniformity of the light emitted by the light source 101 needs to be compensated. In the implementation, the degree of uniformity of the light can be improved by adjusting the angle of the lens, the angle of the lens array 102 and the like.

Therefore, according to the embodiment of the present disclosure, the digital exposure apparatus includes a lens array, the lens array at least including a first lens unit and a second lens unit, a light transposing assembly arranged on an exit light path of the second lens unit, and the light transposition assembly being used for controlling a light exiting from the second lens unit to be transposed with respect to an exposure direction of the digital exposure apparatus. When the digital exposure apparatus is used for exposure, a light passing through the first lens unit and a light penetrating through the second lens unit are needed to expose the same position for multiple times. Due to the light passing through the first lens unit and the transposition of the light penetrating through the second lens unit with respect to the exposure direction of the digital exposure apparatus, even if a light emitted by a light source is not uniform, due to the first lens unit, after the light is transposed, the degree of non-uniformity of the exposures of the same position is counteracted, thereby improving the exposure result uniformity of the digital exposure apparatus and contributing to improve the exposure effect.

An embodiment of the present disclosure also provides an exposure method.

The exposure method of this embodiment is applied to any one of the above-described digital exposure apparatuses, and the method includes a step of exposing an exposure area of the digital exposure apparatus, and the step of exposing the exposure area of the digital exposure apparatus includes:

a light emitted by the light source is controlled to pass through the first lens unit, and the exposure area is exposed by using the light passing through the first lens unit; and a light emitted by the light source is controlled to sequentially pass through the second lens unit and the light transposition assembly, and the exposure area is exposed by using the light which passes through the second lens unit and is transposed.

In this embodiment, when the patterning process needs to be carried out, a plurality of lens units on the lens array need to be sequentially controlled to be turned on and turned off, so that the lights pass through the corresponding lens units and then are used to expose a target area for multiple times to complete the patterning process.

While the lens unit is turned on, the light from the light source passes through the lens unit and is further transmitted to the exposure area, it should be understood that the light passing through the lens unit may be directly transmitted to the exposure area, or other structures may exist between the lens array and the exposure area, such as the lens and other optical path assemblies.

In the exposure process, when the first lens unit is turned on, the light passes through the first lens unit and then is transmitted to the exposure area to expose the exposure area, and when the second lens unit is turned on, the light passes through the second lens unit and the light transposition assembly to expose the exposure area.

As shown in FIG. 3, due to the light passing through the first lens unit and the transposition of the light penetrating through the second lens unit with respect to the exposure direction of the digital exposure apparatus, even if a light emitted by the light source is not uniform, due to the first lens unit, after the light is transposed, the degree of non-uniformity of the exposures of the same position is counteracted, thereby improving the exposure result uniformity of the digital exposure apparatus and contributing to improve the exposure effect.

In some embodiments, in the case of being applied to the digital exposure apparatus shown in FIG. 5 of the first aspect, the step of exposing the exposure are of the digital exposure apparatus includes:

the optical path control module is controlled to be in the first operating state, so that a light passing through the lens array is transmitted to the exposure area of the digital exposure apparatus through the optical path control module.

In this embodiment, when the exposure operation is needed, the optical path control module is controlled to be in the first operating state. In one embodiment, illustratively, as shown in FIG. 5, the first surface of the first light guide and the second surface of the second light guide are controlled to be abutted against each other, so that the light is not totally reflected at the first surface, the light is controlled to be transmitted to the exposure area to expose products.

In some embodiments, in the case of being applied to the digital exposure apparatus shown in FIG. 6 of the first aspect, the method further includes:

the optical path control module is controlled to be in the second operating state;

the intensity and uniformity of a light transmitted to the optical sensor through the optical path control module is detected by using the optical sensor; and the light source is compensated according to a detection result.

As shown in FIG. 6, when the optical path control module is in the second operating state, the light is not transmitted to the exposure area, but transmitted to the optical sensor. Illustratively, in one embodiment, the light is totally reflected at the first surface of the first light guide member to be reflected to the optical sensor.

When the brightness value detected by each sensor unit is greater than a certain brightness threshold value, the intensity of the light provided by the light source meets the use requirement, if the brightness value does not reach the brightness threshold value, the control process of the light source can be compensated, and the exit brightness of the light source is improved to meet the use requirement.

When the difference value between the brightness values detected by the sensor units is relatively small, the degree of uniformity of the light source is relatively high, otherwise, when the difference value between the brightness values detected by the sensor units is relatively large, the degree of uniformity of the light source is relatively low, and the degree of uniformity of the light emitted by the light source needs to be compensated. In the implementation, specifically, the degree of uniformity of the light can be improved by adjusting the angle of the lens, the angle of the lens array and the like, so that the light can be compensated.

The above embodiments are merely specific implementation modes of the present disclosure, but the scope of protection of the present disclosure is not limited thereto, and any modification and substitution be apparent to those skilled in the art without departing from the technical scope of the present disclosure shall be covered by the scope protection of the present disclosure. Accordingly, the scope of protection of the present disclosure is as set forth in the claims.

The invention claimed is:

1. A digital exposure apparatus, comprising a light source, a lens array and a light transposition assembly, wherein the lens array is arranged on an exit light path of the light source, the lens array at least comprises a first lens unit and a second lens unit, multiple first lens units and multiple second lens units are arranged in an array, and the light transposition assembly is arranged on an exit light path of the second lens unit, and the light transposition assembly is used for controlling a light exiting from the second lens unit to be transposed with respect to an exposure direction of the digital exposure apparatus, wherein the light transposition assembly at least comprises a first concave mirror and a second concave mirror, the first concave mirror and the second concave mirror are arranged face-to-face, and optical axis directions of the first concave mirror and the second concave mirror are parallel to each other.

2. The digital exposure apparatus according to claim 1, wherein the first lens unit and the second lens unit are respectively located on both sides of a target axis of the lens array, wherein the target axis is a central axis of the lens array perpendicular to the exposure direction of the digital exposure apparatus.

3. The digital exposure apparatus according to claim 1, further comprising a detection assembly, wherein the detection assembly comprises an optical sensor and an optical path control module, and the optical path control module at least has a first operating state and a second operating state.

4. The digital exposure apparatus according to claim 3, wherein in the first operating state, a light exiting along the lens array is transmitted to an exposure area of the digital exposure apparatus through the optical path control module.

5. The digital exposure apparatus according to claim 3, wherein in the second operating state, a light exiting along the lens array is transmitted to the optical sensor through the optical path control module.

6. The digital exposure apparatus according to claim 3, wherein the optical path control module comprises a first light guide member, the first light guide member comprises a first surface, and total reflection occurs at the first surface of the first light guide member.

7. The digital exposure apparatus according to claim 6, wherein an angle between a direction of a normal line of the first surface located inside the first light guide member and a light exit direction of the lens array is smaller than a total reflection angle corresponding to a light of the light source transmitted to a gas environment in which the digital exposure apparatus operates through the first light guide member.

8. The digital exposure apparatus according to claim 3, wherein the optical path control module comprises a second light guide member, the second guide member comprises a second surface, and a material of the first light guide member and a material of the second light guide member are the same.

9. The digital exposure apparatus according to claim 8, wherein the first surface of the first light guide member and the second surface of the second light guide member are arranged face-to-face.

10. The digital exposure apparatus according to claim 9, wherein in the first operating state, the first surface of the first light guide member is abutted against the second surface of the second light guide member.

11. The digital exposure apparatus according to claim 9, wherein in the second operating state, the first surface of the first light guide member is separated from the second surface of the second light guide member.

12. The digital exposure apparatus according to claim 3, wherein the optical sensor comprises a base and a plurality of sensor units, and the plurality of sensor units are arranged in an array on the base.

13. The digital exposure apparatus according to claim 3, wherein the optical sensor is arranged on an optical path corresponding to total reflection of the light of the light source occurred at the first surface.

14. The digital exposure apparatus according to claim 1, wherein patterning processing of the digital exposure apparatus is dot-scanning exposure of graphics by means of a microprism in a digital micromirror device (DMD) unit.

15. The digital exposure apparatus according to claim 1, further comprising:
   a reflecting sheet used for reflecting a light emitted by the light source;
   a beam collection plate used for collecting lights when the lens array is in a non-operational state; and
   an optical path assembly used for implementing light transmission,
   wherein the optical path assembly is a lens.

16. An exposure method applied to the digital exposure apparatus according to claim 1, wherein the method comprises a step of exposing an exposure area of the digital exposure apparatus, and the step of exposing the exposure area of the digital exposure apparatus comprises:
   controlling a light emitted by the light source to pass through the first lens unit, and exposing the exposure area by using the light passing through the first lens unit; and
   controlling a light emitted by the light source to sequentially pass through the second lens unit and the light transposition assembly, and exposing the exposure area by using the light which passes through the second lens unit and is transposed.

17. The method according to claim 16, wherein in the case of being applied to the digital exposure apparatus of claim 4, the step of exposing the exposure area of the digital exposure apparatus comprises:
   controlling the optical path control module to be in the first operating state so that the light passing through the lens array is transmitted to the exposure area of the digital exposure apparatus through the optical path control module.

18. The method according to claim 17, wherein in the case of being applied to the digital exposure apparatus of claim 5, the method further comprises:
   controlling the optical path control module to be in the second operating state;
   detecting the intensity and uniformity of a light transmitted to the optical sensor through the optical path control module by using the optical sensor; and
   compensating the light source according to a detection result.

19. A digital exposure apparatus, comprising a light source, a lens array and a light transposition assembly, wherein the lens array is arranged on an exit light path of the light source, the lens array at least comprises a first lens unit and a second lens unit, multiple first lens units and multiple second lens units are arranged in an array, and the light transposition assembly is arranged on an exit light path of the second lens unit, and the light transposition assembly is used for controlling a light exiting from the second lens unit to be transposed with respect to an exposure direction of the digital exposure apparatus,
   wherein the digital exposure apparatus further includes a detection assembly, the detection assembly comprises an optical sensor and an optical path control module, and the optical path control module at least has a first operating state and a second operating state,
   wherein the optical path control module comprises a first light guide member, the first light guide member comprises a first surface, and total reflection occurs at the first surface of the first light guide member,
   wherein an angle between a direction of a normal line of the first surface located inside the first light guide member and a light exit direction of the lens array is smaller than a total reflection angle corresponding to a light of the light source transmitted to a gas environment in which the digital exposure apparatus operates through the first light guide member.

20. A digital exposure apparatus, comprising a light source, a lens array and a light transposition assembly, wherein the lens array is arranged on an exit light path of the light source, the lens array at least comprises a first lens unit and a second lens unit, multiple first lens units and multiple second lens units are arranged in an array, and the light transposition assembly is arranged on an exit light path of the second lens unit, and the light transposition assembly is used for controlling a light exiting from the second lens unit to be transposed with respect to an exposure direction of the digital exposure apparatus,
   wherein the digital exposure apparatus further includes:
      a reflecting sheet used for reflecting a light emitted by the light source;
      a beam collection plate used for collecting lights when the lens array is in a non-operational state; and
      an optical path assembly used for implementing light transmission.

* * * * *